United States Patent [19]

Neisius et al.

[11] 4,070,203

[45] Jan. 24, 1978

[54] METHOD FOR STRIPPING PHOTOLACQUERS

[75] Inventors: Karl Heinz Neisius; Wilhelm Bäumer, both of Darmstadt, Germany

[73] Assignee: Merck Patent Gesellschaft mit beschrankter Haftung, Darmstadt, Germany

[21] Appl. No.: 631,660

[22] Filed: Nov. 13, 1975

[30] Foreign Application Priority Data

Nov. 16, 1974 Germany .............................. 2454399

[51] Int. Cl.² ................................................ B08B 3/08
[52] U.S. Cl. ........................................ 134/3; 134/38; 252/143; 252/DIG. 8; 252/364
[58] Field of Search ....................... 134/3, 38; 252/143, 252/144, 171, 364, DIG. 8

[56] References Cited

U.S. PATENT DOCUMENTS

| | | | |
|---|---|---|---|
| 985,405 | 2/1911 | Ellis | 252/DIG. 8 |
| 1,185,641 | 6/1916 | Ellis | 134/38 X |
| 2,607,741 | 8/1952 | Arkis et al. | 252/DIG. 8 |
| 2,750,343 | 6/1956 | Beber | 252/DIG. 8 |
| 3,179,609 | 4/1965 | Morison | 134/38 X |
| 3,574,123 | 4/1971 | Laugle | 134/38 X |
| 3,582,401 | 6/1971 | Berilla et al. | 134/38 X |
| 3,592,691 | 7/1971 | Stelter | 252/364 X |
| 3,625,763 | 12/1971 | Melillo | 252/364 X |
| 3,629,004 | 12/1971 | Cooper et al. | 134/38 X |
| 3,813,309 | 5/1974 | Bakos et al. | 134/38 X |

*Primary Examiner*—S. Leon Bashore
*Assistant Examiner*—Marc L. Caroff
*Attorney, Agent, or Firm*—Millen & White

[57] ABSTRACT

Hardened photolacquer on semi-conductors and integrated circuits for etching purposes are stripped therefrom employing, preferably at a temperature above 75° C., a stripping composition consisting essentially of 20-50 weight percent of at least one alkylbenzenesulfonic acid of 12-20 carbon, and 80-50 weight percent of a chlorine-free, aromatic hydrocarbon having a boiling point above 150° C.

6 Claims, No Drawings

METHOD FOR STRIPPING PHOTOLACQUERS

BACKGROUND OF THE INVENTION

This invention relates to stripping compositions for stripping hardened photolacquers from etched semiconductors and integrated circuits and to a stripping process employing them.

In the production of semi-conductors and integrated circuits by controlled etching, the portion of the substrate which is not to be etched is, as a rule, protected by a layer of a hardened photolacquer. After the etching is completed, this etching mask must then be removed from the substrate. Stripping agents, also called strippers, are used to strip off the lacquer layer as quickly as possible and without mechanical stress to the substrate. They must be substantially free from impurities in order to avoid undesired doping effects on the substrate. Such stripping agents conventionally are a mixture of one or more surface-active compounds, at least one phenolic compound and one or more chlorinated hydrocarbons. For example, in U.S. Pat. No. 3,582,401, strippers are disclosed which consist of an arylsulphonic acid of the general formula:

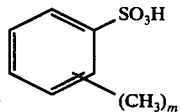

wherein $m$ is 0, 1 or 2; at least one phenolic component, such as; for example, phenol, a cresol, a xylenol or a halophenol; and at least one non-aqueous, halogenated diluent with a boiling point above 75° C., for example, carbon tetrachloride, trichloroethylene, tetrachloroethylene or o-dichlorobenzene. Similar preparations containing a long-chained alkylbenzenesulfonic acids as the surface-active agent are also commercially available.

However, these stripping agents for photolacquers possess several disadvantages which make their use difficult. One in particular is the toxicity of the phenol and chlorinated hydrocarbon components. To avoid damage to the health by these substances in use, laborious and expensive preventative measures are necessary.

A further disadvantage of the known above-described strippers is seen in their use to remove photolacquer layers which have been post-hardened for a comparatively long time at elevated temperatures. For the satisfactory removal of such etch masks, the conventional stripping agents are heated to a temperature of above 75° C., preferably about 100° C. At these temperatures, the solvents in the known strippers are very volatile, causing clear weight losses of the stripping agent bath in a comparatively short time, which leads to a loss in efficiency. To compensate for these losses, the bath must be supplemented at short intervals of time, frequently every 30-60 minutes, with fresh stripping agent.

It is an object of this invention to provide stripping agents for photolacquers which do not possess these disadvantages or do so to a considerably reduced extent.

It has now been found that one obtains a practically non-toxic, effective stripper with substantially reduced volatility when one dissolves 20-50 weight percent of an alkylbenzenesulfonic acid with 12-20 carbon-atoms in 80-50 weight percent of a chlorine-free, high boiling hydrocarbon.

SUMMARY OF THE INVENTION

In a composition aspect, this invention relates stripping agents for stripping photolacquers, consisting essentially of 20-50 weight percent of an alkylbenzenesulfonic acid of 12-20 carbon atoms and 80-50 weight percent of a high boiling aromatic hydrocarbon solvent.

In a method of use aspect, this invention relates to a method of stripping hardened laquers from substrates employing a stripping agent of this invention.

DETAILED DISCUSSION

The alkylbenzenesulfonic acids employed in the agents of this invention are known and commercially available. Those with 14-18 carbon atoms are preferred, especially octylbenzenesulfonic acid, nonylbenzenesulfonic acid and dodecylbenzenesulfonic acid. The preferred strippers of this invention contains 30-40 weight percent of an alkylbenzenesulfonic acid defined above. Mixtures of two or more of these alkylbenzenesulfonic acids can also be employed.

The high boiling aromatic hydrocarbon solvent component of the strippers of this invention are liquids having a boiling point or boiling range above 150° C., preferably above 180° C. and more preferably those with a boiling point in the range of 200°-260° C. Particularly suitable as solvents are alkylbenzenes of 9-18 carbon atoms. Because of their ready availability, the commercially available, high boiling aromatic hydrocarbon solvents with an aromatic content of about 80-99 weight percent are preferably employed, the remainder being up to 19 weight percent of one or more saturated aliphatic or cycloaliphatic hydrocarbons and no more than 2 weight percent of olefinically unsaturated hydrocarbons. Solvents of this type are hereby expressly included into the definition of aromatic solvents as used in connection with the present invention.

Most of these commercially available solvents consist of mixtures of the isomeric and homologous alkylbenzenes of 9-18, and preferably 10-16, carbon atoms. They are usually available commercially in the requisite degree of purity for this use, i.e. free of metal ions, dust and/or high molecular weight or resinous impurities. If necessary, they can also be purified by simple methods, for example, distillation or chromatography, to such an extent that no undesired doping materials are introduced by them into the stripping agents produced therewith.

The strippers according to the invention contain no toxic components and, their use is environmentally much superior to that of the previous strippers, as is evident from the following experiment:

A commercially available stripper consisting of 20 weight percent dodecylbenzenesulfonic acid, 20 weight percent phenol, 30 weight percent tetrachloroethylene and 30 weight percent o-dichlorobenzene and a stripper according to the invention consisting of 35 weight percent dodecylbenzenesulfonic acid and 65% of an aromatic, chlorine-free hydrocarbon mixture with a boiling range of 205°-250° C., are separately heated, with stirring, to 100° C. After equal times, the weight losses thereof after various times at that temperature are determined. The results are summarized in the following table.

| Time (min.) | Weight Loss (%) | |
|---|---|---|
| | phenol-containing stripper | stripper of this invention |
| 30 | 23 | 6 |
| 60 | 45 | 15 |
| 120 | 60 | 23 |

Whereas under the usual operating conditions, nearly two thirds of the known stripping agents evaporate in two hours to contaminate the surrounding, only about a fourth of the stripping agents of this invention evaporate in this period of time.

The stripping agents of this invention satisfactorily strip the etching masks formed by all commercially available photolacquers. This is especially surprising in the case of photolacquers based on polar substances, for example, polyvinyl alcohol-cinnamic acid esters, since the stripping agents according to the invention contain substantially less polar substituents then known stripping agents. Layers of hardened photolacquers based on rubbers such as natural rubber, synthetic rubber, e.g., polymers of or copolymers containing 1,3-diolefins, cyclized rubber, or oxidized rubber, which are described in, e.g., U.S. Pat. No. 2,852,379, 2,940,853, 3,669,662, and 3,669,669, whose contents are hereby incorporated by reference, can likewise be removed with the strippers according to the invention.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. The percents in the following Examples are percents by weight.

EXAMPLE 1

35% dodecylbenzenesulfonic acid
65% aromatic solvent mixture, consisting essentially of about 82.5% of mainly $C_9 - C_{15}$ alkylbenzenes, about 17% saturated aliphatic and cycloaliphatic hydrocarbons, and about 0.5% olefinically unsaturated hydrocarbons, with a boiling range of 205°–250° C. (Shellsol ® R).

EXAMPLE 2

40% octylbenzenesulfonic acid
60% cumol

EXAMPLE 3

30% nonylbenzenesulfonic acid
70% aromatic solvent mixture with a boiling range of 180°–230° C.

EXAMPLE A Use of Stripping Agents

Etching masks applied to silicon discs of a commercially-available photolacquer based on polyvinyl alcohol-cinnamic acid esters (commercial name KPR, producer: Eastman Kodak Co.) were post-hardened for 1 hour at 150° C. After five minutes immersion and movement of the masked disc in a bath, heated to 90°–100° C., of the stripping agent of Example 1, the photolacquer layer is satisfactorily removed without leaving a residue.

The same result is achieved with the stripping agents of Examples 2 and 3.

The same result is also achieved when stripping commercially available photolacquers based on synthetic rubber (commercial designation: KTFR or KMER, producer: Eastman Kodak Co.; Waycoat SC or IC, produced by hunt Chemical Corp.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a method of stripping a hardened photolacquer etching mask from the surface of an etched electronic component substrate coated therewith by contacting the surface of the substrate with a stripping agent for the photolacquer which is free of metal ions, dust and high molecular weight and resinous impurities, the improvement wherein the stripping agent is a substantially impurity-free mixture of 20–50 weight percent of at least one alkylbenzenesulfonic acid of 12–20 carbon atoms and the remaining 80–50 weight percent of the mixture being a chlorine-free, aromatic hydrocarbon solvent having a boiling point above 150° C.

2. A method according to claim 1 wherein the alkylbenzenesulfonic acid is one or more of octylbenzenesulfonic acid, nonylbenzenesulfonic acid or dodecylbenzenesulfonic acid.

3. A method according to claim 1 wherein the aromatic hydrocarbon solvent is one or more alkylbenzenes of 9–18 carbon atoms.

4. A method according to claim 1 wherein the aromatic hydrocarbon is a mixture of alkylbenzenes having a boiling range of 200°–260° C.

5. A method according to claim 1 wherein the stripping agent is a mixture consisting of 30–40 weight percent of at least one alkylbenzenesulfonic acid of 14–18 carbon atoms and 70–60 weight percent of an aromatic hydrocarbon solvent boiling in the range of 200°–260° C. and consisting, by weight, of 80–99% aromatics and the remainder, up to 19% aliphatic or cycloaliphatic hydrocarbons and no more than 2% of olefinic unsaturated hydrocarbons.

6. A method according to claim 1 wherein the stripping agent is a mixture consisting essentially of 30–40% of octylbenzenesulfonic acid, nonylbenzenesulfonic acid or dodecylbenzenesulfonic acid and 70–60% of one or more alkylbenzenes of 9–18 carbon atoms.

* * * * *